(12) United States Patent
Rose et al.

(10) Patent No.: US 10,121,910 B2
(45) Date of Patent: *Nov. 6, 2018

(54) FORMED PHOTOVOLTAIC MODULE BUSBARS

(71) Applicant: SunPower Corporation, San Jose, CA (US)

(72) Inventors: Douglas Rose, Mountain View, CA (US); Shan Daroczi, Santa Clara, CA (US); Thomas Phu, Alameda, CA (US)

(73) Assignee: SunPower Corporation, San Jose, CA (US)

( * ) Notice: Subject to any disclaimer, the term of this patent is extended or adjusted under 35 U.S.C. 154(b) by 605 days.

This patent is subject to a terminal disclaimer.

(21) Appl. No.: 14/877,785

(22) Filed: Oct. 7, 2015

(65) Prior Publication Data

US 2016/0035908 A1  Feb. 4, 2016

Related U.S. Application Data

(63) Continuation of application No. 11/543,440, filed on Oct. 3, 2006, now Pat. No. 9,184,327.

(51) Int. Cl.
| | | |
|---|---|---|
| *H01L 31/02* | (2006.01) | |
| *H01L 31/05* | (2014.01) | |
| *H01L 31/0465* | (2014.01) | |
| *H02S 40/34* | (2014.01) | |

(52) U.S. Cl.
CPC .... *H01L 31/0201* (2013.01); *H01L 31/02013* (2013.01); *H01L 31/0465* (2014.12); *H01L 31/05* (2013.01); *H01L 31/0508* (2013.01); *H02S 40/34* (2014.12); *Y02E 10/50* (2013.01)

(58) Field of Classification Search
CPC .......... H01L 31/0201; H01L 31/02013; H01L 31/0465; H01L 31/05; H01L 31/0508; H02S 40/34; Y02E 10/50
See application file for complete search history.

(56) References Cited

U.S. PATENT DOCUMENTS

| | | |
|---|---|---|
| 3,340,096 A | 9/1967 | Mann et al. |
| 3,825,999 A | 7/1974 | Rubey |
| 4,652,693 A | 3/1987 | Bar-On |
| 5,391,235 A | 2/1995 | Inoue |

(Continued)

FOREIGN PATENT DOCUMENTS

| | | |
|---|---|---|
| DE | 2942328 | 4/1981 |
| EP | 0095843 | 12/1983 |

(Continued)

OTHER PUBLICATIONS

Examination Report from Australian Patent Application No. 2007305487 dated Oct. 15, 2010, 3 pgs.

(Continued)

*Primary Examiner* — Lindsey A Bernier
(74) *Attorney, Agent, or Firm* — Schwabe, Williamson & Wyatt, P.C.

(57) ABSTRACT

A photovoltaic system including a cell connection piece coupled to a plurality of photovoltaic cells and a terminal of a junction box. The cell connection piece includes an interconnect bus, a plurality of bus tabs unitarily formed with the interconnect bus, and a terminal bus coupled with the interconnect bus. The plurality of bus tabs extend from the interconnect bus. The terminal bus includes a nonlinear portion.

16 Claims, 10 Drawing Sheets

(56) References Cited

U.S. PATENT DOCUMENTS

2005/0268959 A1    12/2005    Aschenbrenner et al.
2006/0032527 A1    2/2006    Stevens et al.

FOREIGN PATENT DOCUMENTS

| | | |
|---|---|---|
| EP | 1 037 309 | 9/2000 |
| EP | 1120837 | 8/2001 |
| JP | 2000323208 | 11/2000 |

OTHER PUBLICATIONS

Final Office Action for U.S. Appl. No. 11/543,440, dated Aug. 18, 2010, 10 pgs.

Non-Final Office Action for U.S. Appl. No. 11/543,440, dated Jan. 25, 2011, 10 pgs.

Final Office Action for U.S. Appl. No. 11/543,440, dated Jun. 23, 2011, 11 pgs.

Non-Final Office Action for U.S. Appl. No. 11/543,440, dated Sep. 20, 2013, 12 pgs.

Office Action for Japanese Patent Application No. 2009-531398 dated Aug. 28, 2012, 4 pgs.

Office Action for Korean Patent Application No. 10-2009-7008913 dated Oct. 31, 2013, 4 pgs.

Final Office Action from U.S. Appl. No. 11/543,440 dated Apr. 22, 2014, 11 pgs.

Non-Final Office Action from Korean Patent Application No. 10-2009-7008913 dated Apr. 30, 2014, 2 pgs.

Non-Final Office Action from U.S. Appl. No. 11/543,440 dated Mar. 3, 2010, 8 pgs.

Extended European Search Report from EP 07838904.6 dated Jul. 21, 2014, 6 pgs.

Office Action from European Patent Application No. 07 838 904.6-150 dated Oct. 16, 2015, 4 pgs.

Office Action from Israel Patent Application No. 197886 dated Mar. 7, 2012, 1 pg.

Non-Final Office Action for U.S. Appl. No. 11/543,440, dated May 18, 2009, 20 pgs.

International Preliminary Report on Patentability and Written Opinion from PCT/US2007/020801 dated Apr. 16, 2009, 6 pgs.

Final Office Action for U.S. Appl. No. 11/543,440, dated Oct. 2, 2009, 9 Pages.

Christensen, Elmer, "Electricity from Photovoltaic Solar Cells, Flat-Plate Solar Array Project", US DOE, Oct. 1985.

International Search Report, PCT/US07/20801, filed Sep. 26, 2007, dated Sep. 15, 2008.

UNK., "Solar Module SP75", http://www.nootage.com/pdf/siemns-sp75.pdf.

UNK., "Shell Solar Modules—Photovoltaic Power Modules", Advanced Energy Online.com, http://www.advancedenergyonline.com/catalog/solar/shell.htm.

UNK., "Shell Solar, Shell PowerMax(r) solar modules for off-grid markets", http://www.partsonsale.com/shell85-2.pdf.

Extended European Search Report for European Patent Application No. 16192857 dated Jan. 19, 2017, 7 pgs.

FORMED PHOTOVOLTAIC MODULE BUSBARS

CROSS-REFERENCE TO RELATED APPLICATIONS

This application is a continuation of U.S. patent application Ser. No. 11/543,440, filed on Oct. 3, 2006, the entire contents of which are hereby incorporated by reference herein.

FEDERALLY SPONSORED RESEARCH OR DEVELOPMENT

This invention was made with Government support under ZAX-4-33628-05 awarded by the United States Department of Energy under the photovoltaic (PV) Manufacturing Research and Development (R & D) Program, which is administered by the National Renewable Energy Laboratory. The Government has certain rights in the invention.

TECHNICAL FIELD

This invention relates to the field of photovoltaic modules and, in particular, to busbar components for photovoltaic modules.

BACKGROUND

Photovoltaic (PV) cells provide a renewable source of electrical energy. When PV cells are combined in an array such as in a PV module, the electrical energy collected from all of the PV cells can be combined in series and parallel arrangements to provide power with a certain voltage and current. Many recent design and engineering advances have increased the efficiency and functionality of PV modules.

One area of development focuses on collecting the electrical energy from all of the PV cells in a PV module so that the collected electrical energy can be efficiently transferred to an electrical load connected to the PV system. For example, SunPower Corporation of San Jose, Calif., offers a highly efficient solar cell design which locates the metal contacts needed to collect and conduct electricity on the back surface of the PV cells so that cell interconnections do not block incident sunlight.

Another area of development relates to wiring techniques which might lower the manufacturing cost of PV module components and facilitate a better design layout of such components on the PV module. FIG. 1 illustrates a conventional busbar 10 for a PV module. The illustrated conventional busbar 10 includes an interconnect bus 12, a plurality of individual bus tabs 14, and a linear terminal bus 16. Different busbar designs may implement fewer or more bus tabs 14 than shown. The individual bus tabs 14 are typically soldered or welded to the interconnect bus 12 at corresponding solder or welding joints 18. The linear terminal bus 16 is soldered to the interconnect bus 12 at a similar solder or welding joint 18. The bus tabs 14 connects to electrical contacts or ribbons for each row of PV cells, and the terminal bus 16 connects the interconnect bus 12 to a junction box on the PV module.

FIG. 2 illustrates another conventional busbar 30 for a PV module having back contact cells. The conventional busbar 30 of FIG. 2 is similar to the conventional busbar 10 of FIG. 1, except that the conventional busbar 30 does not have a terminal bus 16. These types of conventional busbars 30 are typically used to connect adjacent rows of PV cells to one another. Other types of cell interconnects are used to connect individual PV cells to one another within the rows of PV cells.

Wire flattening is another conventional technology to form busbars. Wire flattening employs a bending machine to bend wire into a specified shape and then a flattening machine to flatten the shaped wire into a flattened sheet having a shape corresponding to the shaped wire.

Some conventional busbars suffer from several disadvantages. For example, the use of linear components in conventional busbars results in relatively long electrical path lengths and, hence, increased voltage drop between the rows of PV cells and the junction box.

Also, the design and layout of conventional busbars is typically limited by the availability of conductive ribbons. If multiple ribbon sizes are used, then the inventory costs of purchasing, storing, and handling the various ribbon sizes are increased. On the other hand, if only one ribbon size is used, the design and layout of the conductive paths is limited by the physical characteristics (e.g., width, thickness, etc.) of the available ribbon.

Conventional busbars also implement several solder or welding joints for each busbar (e.g., seven joints for the conventional busbar 30 of FIG. 1). These joints are sources of potential physical failure of the busbar. The thickness of these joints also creates stress on the corresponding PV cells, which can break and become useless. For example, the joints can add extra stress on the PV cells during module manufacturing, and the PV cells can crack, which degrades cell performance. Such breakage is frequently at the edges of PV cells because the linear configuration of conventional busbars results in a portion of the conventional busbar extending beyond the edge of the typically cropped corners of the PV cells. Additionally, the cost of assembly of conventional busbars is relatively high because the fabrication process implements multiple solder or welding joints for each conventional busbar.

BRIEF DESCRIPTION OF THE DRAWINGS

The present invention is illustrated by way of example, and not by way of limitation, in the figures of the accompanying drawings.

DETAILED DESCRIPTION

Figure 1:
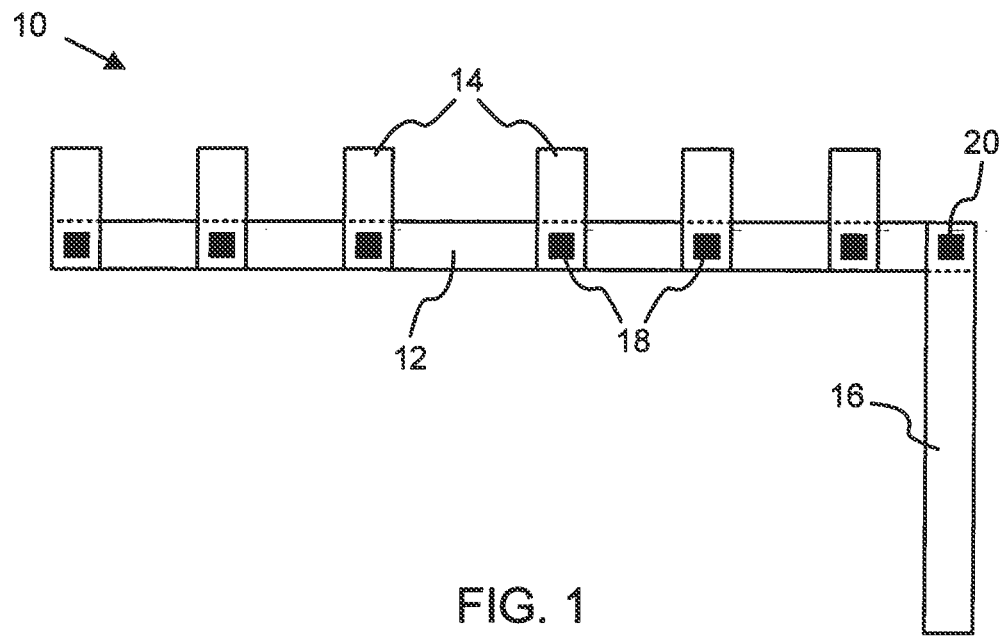
FIG. 1 illustrates a conventional busbar for a photovoltaic module.
Figure 2:
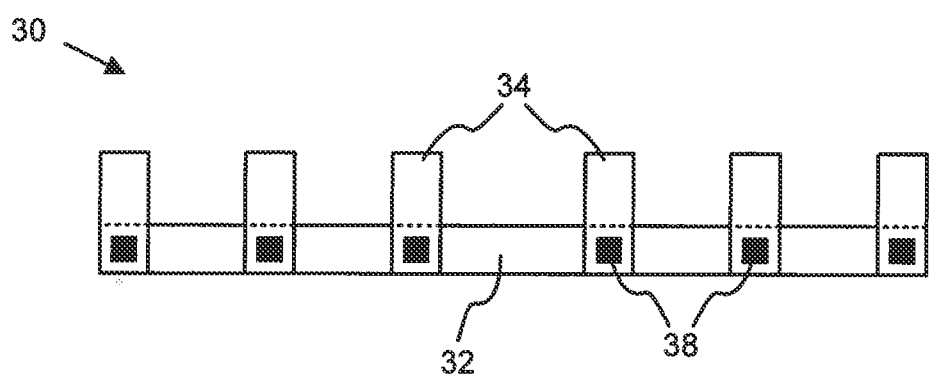
FIG. 2 illustrates another conventional busbar for a photovoltaic module having back contact cells.

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

In general, this disclosure relates to unitarily formed busbar components for photovoltaic (PV) modules. The term "elements" is used to describe unitary features of a unitarily formed busbar component. In contrast, the present application uses the terms "pieces" and "parts" to refer to non-unitarily formed components. Thus, a conventional, non-unitarily formed busbar component has separate pieces.

In one embodiment, a method includes providing a sheet of conductive material, and forming a photovoltaic module busbar component from the sheet of conductive material. In some embodiments, the busbar component may be a cell connection piece having an interconnect bus and a plurality of unitarily formed bus tabs. In some embodiments, the busbar component may be a terminal bus having a nonlinear portion. Other embodiments of the method are also described.

In one embodiment, a cell connection piece includes an interconnect bus and a plurality of bus tabs. The plurality of bus tabs are unitarily formed with the interconnect bus and extend away from the interconnect bus. In some embodiments, the cell connection piece is used to connect to a row of PV cells. In some embodiments, the interconnect bus has a continuously variable width along a length of the interconnect bus. Alternatively, the interconnect bus may have a step-wise variable width along a length of the interconnect bus.

In some embodiments, the interconnect bus includes an extension, at an end of the interconnect bus, to provide a solder location to solder a terminal bus to the interconnect bus, although other types of coupling other than solder may be implemented. In some embodiments the interconnect bus includes one or more expansion joints to accommodate thermal expansion of the PV module because the PV module may have a different thermal expansion coefficient than the interconnect bus. In some embodiments, the interconnect bus includes a plurality of notches to accommodate a second plurality of bus tabs of a second cell connection piece in a fabrication process of the cell connection pieces. This implementation facilitates increased material utilization in the pattern layout when stamping the cell connection pieces. Other embodiments of the cell connection piece are also described.

In one embodiment, a terminal bus includes a terminal connection end, a cell connection end, and a nonlinear portion. The terminal connection end may be used to couple the terminal bus to an electrical terminal of a junction box. The cell connection end is opposite the terminal connection end and may be used to connect the terminal bus to a cell connection piece or, alternatively, directly to one or more photovoltaic cells. The nonlinear portion is between the terminal connection end and the cell connection end. Other embodiments of the terminal bus are also described.

In one embodiment, an apparatus includes means for coupling a photovoltaic cell of a photovoltaic module to a junction box of the photovoltaic module, and means for reducing a number of coupling joints between the photovoltaic cell and the junction box. In another embodiment, an apparatus includes means for coupling a photovoltaic cell of a photovoltaic module to a junction box of the photovoltaic module, and means for providing a curvilinear electrical pathway between the photovoltaic cell and the junction box. Other embodiments of the apparatus are also described.

Figure 3:
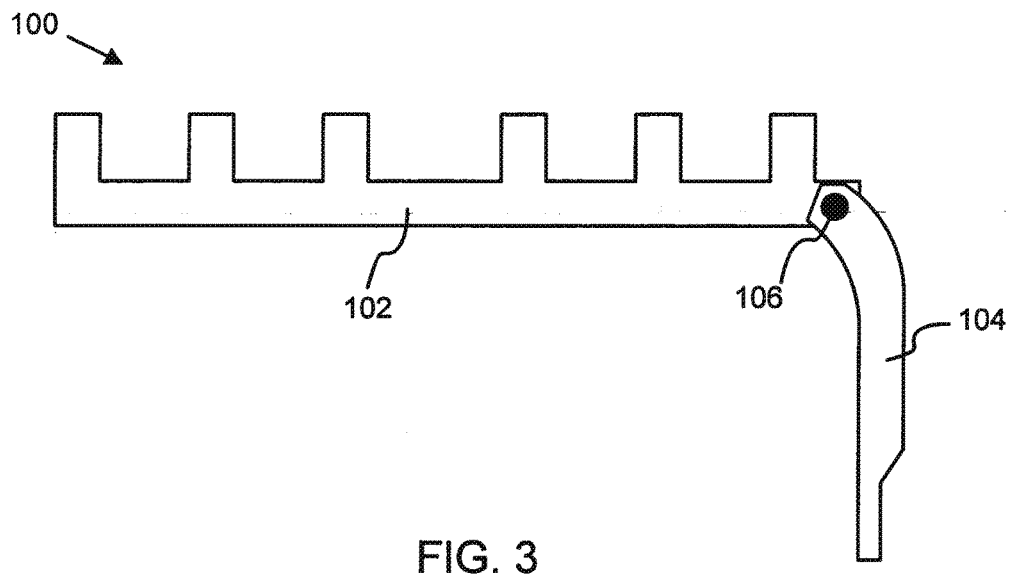
FIG. 3 illustrates one embodiment of a formed busbar for a photovoltaic module.

FIG. 3 illustrates one embodiment of a formed busbar 100 for a photovoltaic (PV) module. The depicted formed busbar 100 includes two formed busbar components: a cell connection piece 102 and a terminal connection piece 104. The cell connection piece 102 facilitates electrical connection at one or more PV cells within the PV module. One example of a cell connection piece 102 is shown and described in more detail with reference to FIG. 4. The terminal connection piece 104 facilitates electrical connection between the cell connection piece 102 and a junction box of the PV module. One example of the terminal connection piece 104 is shown and described in more detail with reference to FIG. 5. In one embodiment, a solder joint 106 may be used to couple the terminal connection piece 104 to the cell connection piece 102. For convenience, the description provided herein refers to soldering, in many instances. However, alternative joining technologies such as welding, electrically conductive adhesives, mechanical fasteners, or other coupling technologies may be implemented.

In another embodiment, the cell connection piece 102 and the terminal connection piece 104 may be formed as a single, unitary piece. Forming the cell connection piece 102 and the terminal connection piece 104 as a single, unitary piece would alleviate the need for a coupling joint such as the solder joint 106.

Figure 4:
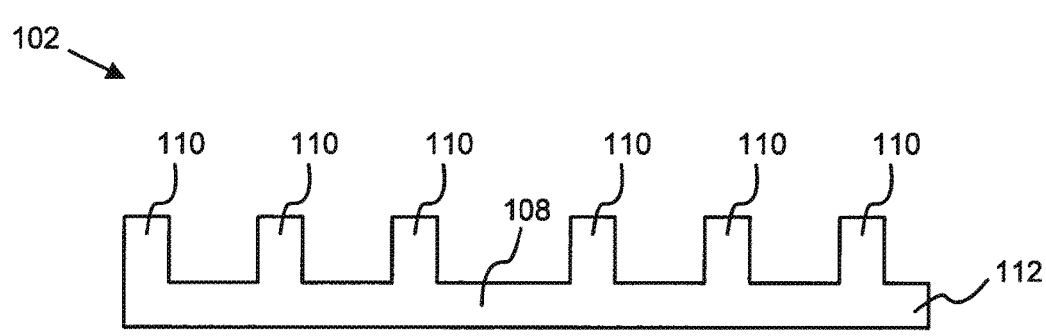
FIG. 4 illustrates a more detailed embodiment of the cell connection piece of FIG. 3.

FIG. 4 illustrates a more detailed embodiment of the cell connection piece 102 of FIG. 3. The depicted cell connection piece 102 includes an interconnect bus 108 and multiple bus tabs 110. In one embodiment, the cell connection piece 102 may include three bus tabs 110 for connections to each of the corresponding PV cells. Alternatively, the cell connection piece 102 may include two bus tabs 110, or more than three bus tabs 110, for each corresponding PV cell.

As depicted in FIG. 4, the bus tabs 110 are unitarily formed with the interconnect bus 108 such that coupling joints are not necessary to couple the bus tabs 110 to the interconnect bus 108. By implementing a unitarily formed cell connection piece 102 without coupling joints, the cell connection piece 102 may have increased mechanical strength and reliability compared to conventional busbar components which use coupling joints. Additionally, the thickness of formed busbar components may be significantly less than the thickness of conventional busbar components which use coupling joints. For example, a conventional busbar component with coupling joints may have a total thickness of about 635 µm (25 mils) (e.g., 127 µm (5 mils) for the first ribbon layer, 101.6 µm (4 mils) for the solder joint, and 254 µm (10 mils) for the second ribbon layer), but a unitarily formed busbar component may have a total thickness of about 127 µm (5 mils)—the thickness of a single metal layer. While the exact thickness of a formed busbar component depends at least in part on the thickness of the metal or other conductive material used, the overall thickness of the formed busbar component is generally substantially less than the overall thickness of a conventional busbar component with solder joints.

In some embodiments, the interconnect bus 108 or the bus tabs 110, or both, may include non-linear portions. For example, the interconnect bus 108 may have a curved shape along the length of the interconnect bus 108. Moreover, the interconnect bus 108 and the bus tabs 110 may intersect at an angle that is not rectilinear. For example, some or all of the individual bus tabs 110 may extend away from the interconnect bus at an angle other than 90 degrees (e.g., 60 degrees). In another example, a bus tab 110 at the end of the interconnect bus 108 may be formed as a curvilinear extension of the interconnect bus 108, so that the interconnect bus 108 curves approximately 90 degrees to form the bus tab 110. With the benefit of this disclosure, various combinations of rectilinear and curvilinear configurations may be implemented. For example, the bus tabs 110 may have rounded ends and rounded interior or exterior corners where the bus tabs 110 intersect the interconnect bus 108.

The depicted cell connection piece 102 also includes an extension 112 at one end of the interconnect bus 108. Alternatively, the extension 112 may be located at an intermediate position on the interconnect bus 108, instead of at one of the ends. In other embodiments, the cell connection piece 102 may omit the extension 112. Where the cell connection piece 102 includes an extension, the extension 112 may provide a more desirable location for the solder joint 106. Where the cell connection piece 102 omits an extension, the solder joint 106 may be located at another position along the length of the interconnect bus 108.

Figure 5:
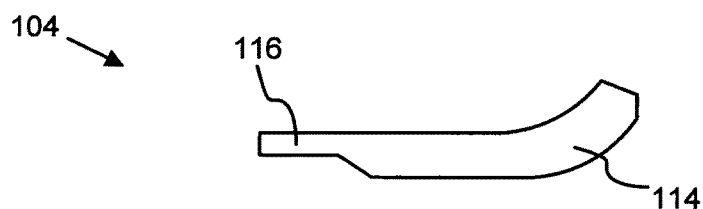
FIG. 5 illustrates a more detailed embodiment of the terminal connection piece of FIG. 3.

FIG. 5 illustrates a more detailed embodiment of the terminal connection piece 104 of FIG. 3. The depicted terminal connection piece 104 is a terminal bus. Although the terminal connection piece 104 is a single piece, and does not necessarily include multiple identified pieces, other embodiments of the terminal connection piece 104 may include multiple identified elements formed in a unitary manner, as described above with references to the cell connection piece 102.

Although both the depicted terminal connection piece 104, or terminal bus, and conventional terminal buses are both single pieces which may be coupled to a corresponding interconnect bus, the depicted terminal bus 104 is different from conventional terminal buses. In one embodiment, the terminal bus 104 includes a non-linear portion 114. The non-linear portion 114 may implement a curvilinear, angular, or other type of non-linear path between the cell connection end and the terminal connection end of the terminal bus 104. Although the non-linear portion 114 is shown primarily at the cell connection end of the terminal bus 104 in FIG. 5, other embodiments may implement one or more non-linear portions 114 at other locations of the terminal bus 104.

The non-linear portion 114 may facilitate one or more advantages over conventional, linear terminal buses. In one embodiment, the location of the non-linear portion 114 of the terminal bus 104 may be designed to avoid an overlap with an edge of a corresponding PV cell. While conventional, linear terminal buses often extend across one or more edges of a PV cell, causing stress on the PV cell and resulting in damage (e.g., cracking or breakage) of the PV cell, the non-linear portion 114 of the illustrated terminal bus 114 may avoid causing mechanical stress at the edge of corresponding PV cells. Thus, the integrity of the PV cells and the PV module, as a whole, may be preserved.

Additionally, the non-linear portion 114 of the terminal bus 104 may provide a shorter electrical path between the cell connection piece 102 and the junction box of the PV module. Given that voltage drop is related to the length of the electrical path between the PV cells and the junction box, implementing a relatively shorter electrical path may result in greater power output from the PV module because less power is consumed in voltage drop. While the increased power output due to decreased voltage drop of a single PV module may seem trivial, the total increase in power output from an array of hundreds or thousands of PV modules may be significant.

The depicted terminal bus 104 also includes a tapered portion 116 at the junction connection end of the terminal bus 104. In one embodiment, the tapered portion 116 facilitates coupling the terminal bus 104 to a terminal within the junction box of the PV module. For example, where a small junction box is used, the tapered portion 116 of the terminal bus 104 may allow the terminal bus 104 to connect to the terminal in the junction box. In contrast, where a non-tapered terminal bus is used, a small junction box might be too small to accommodate the non-tapered width of multiple terminal buses 104.

Figure 6:
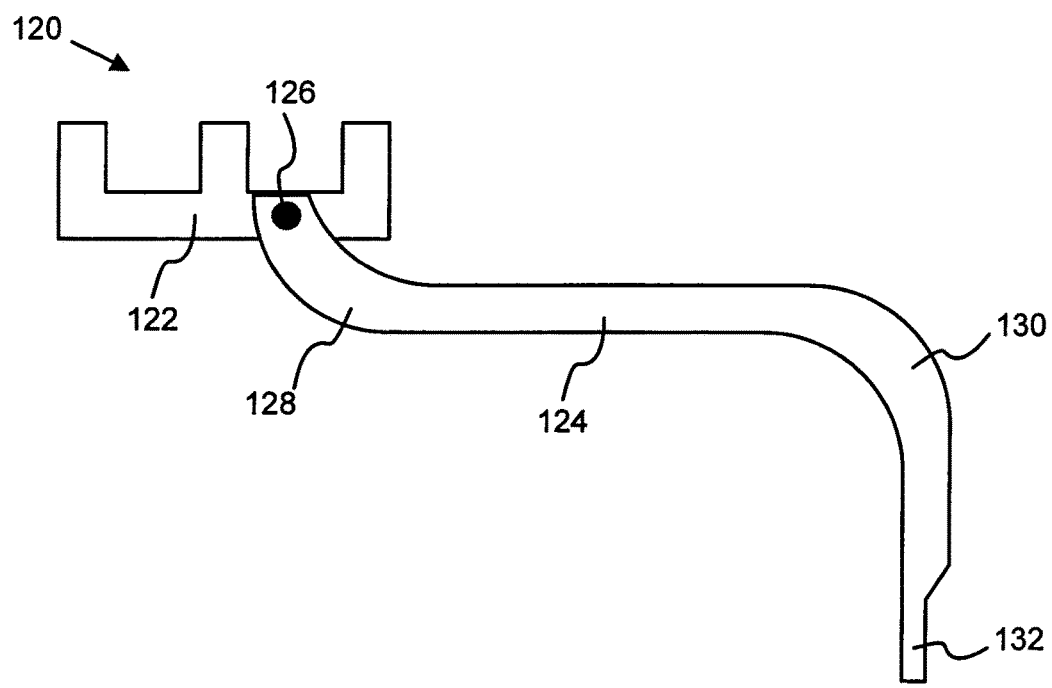
FIG. 6 illustrates another embodiment of a formed busbar for a photovoltaic module.

FIG. 6 illustrates another embodiment of a unitarily formed busbar 120 for a PV module. The depicted formed busbar 120 includes a cell connection piece 122 and a terminal connection piece 124. For purposes of this description, the cell connection piece 122 is substantially similar to the cell connection piece 102 of FIG. 4. However, the cell connection piece 122 is used to connect to a single PV cell, rather than to multiple PV cells. Likewise, the terminal connection piece 124 is substantially similar to the terminal connection piece 104 of FIG. 5, including non-linear portions 128 and 130, as well as a tapered portion 132. However, the terminal connection piece 124 includes multiple non-linear portions 128 and 130 to accommodate a different path from the cell connection piece 122 to a junction box. In particular, the terminal connection piece 124 may facilitate electrical connection to a PV cell which is located a greater distance from the junction box.

Figure 7:
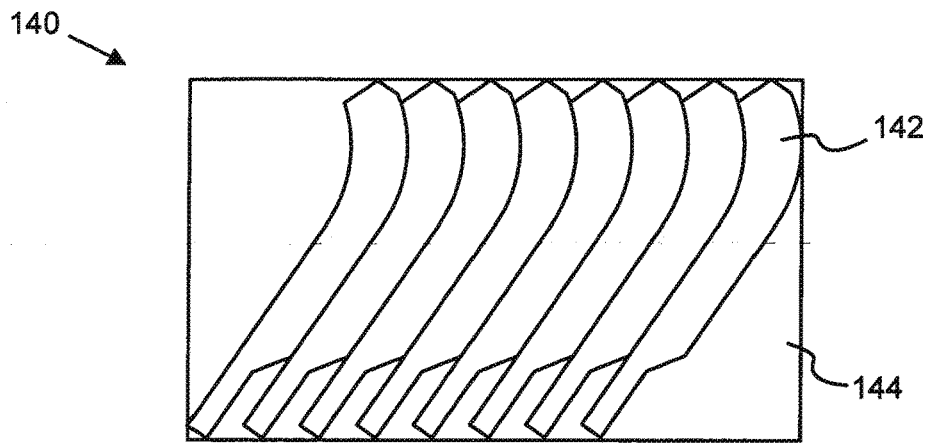
FIG. 7 illustrates one embodiment of a pattern of nested busbar components for photovoltaic modules.

FIG. 7 illustrates one embodiment of a pattern 140 of nested busbar components 142 for PV modules. In particular, the illustrated busbar components 142 are terminal buses 104, although other patterns may accommodate other types of busbar components. In one embodiment, the pattern 140 of nested terminal buses 104 facilitates stamping, or otherwise unitarily forming, a plurality of individual terminal buses 104 from a sheet of conductive material 144. Exemplary conductive materials that may be used include annealed copper with tin, tin-silver, tin-lead, or tin-silver-copper coating, or other electrically conductive materials. For convenience, the description provided herein refers to stamping, in many instances. However, alternative forming technologies such as electrical discharge machining (EDM), water jet cutting, laser cutting (e.g., in a stack), or other forming technologies may be implemented.

Stamping employs a die to cut through a sheet of material. The face of the die includes a pattern that is forced by a heavy duty press to cut through the sheet of material. In one embodiment, the pattern may be for a single component. Alternatively, the pattern may be for several components. For example, the pattern may be for a plurality of similar, nested components, or even for different types of components. Additionally, some stamping mechanisms may include dies that are capable of stamping multiple layers of material in a stack at a single time. In this way, one stamping operation may produce several sets of patterned components (i.e., one set for each sheet of material in the stack).

EDM employs a recurring electrical arcing discharge between an electrode and the metal sheet 144. The electrode follows the pattern 140 to create a series of micro-craters on the metal sheet 144 and to remove material along the cutting path by melting and vaporization. The removed particles are washed away by a dielectric fluid.

Water jet cutting employs a stream of high pressure of water, with or without abrasive additives, through a nozzle to essentially erode the metal sheet 144 along the pattern 140. The nozzle and stream of water follow the pattern 140 to cut the individual busbar components 142 out of the metal sheet 144.

Laser cutting, like water jet cutting, cuts the pattern 140 of busbar components 142 out of the metal sheet 144. However, laser cutting employs a high power laser, instead of a high pressure stream of water. The part of the metal sheet 144 exposed to the laser melts, burns, or vaporizes. Laser cutting can produce a high quality finish on the cut surface. Laser cutting, as well as EDM and water jet cutting, may be employed to cut several sheets 144 at once in a stack.

Figure 8:
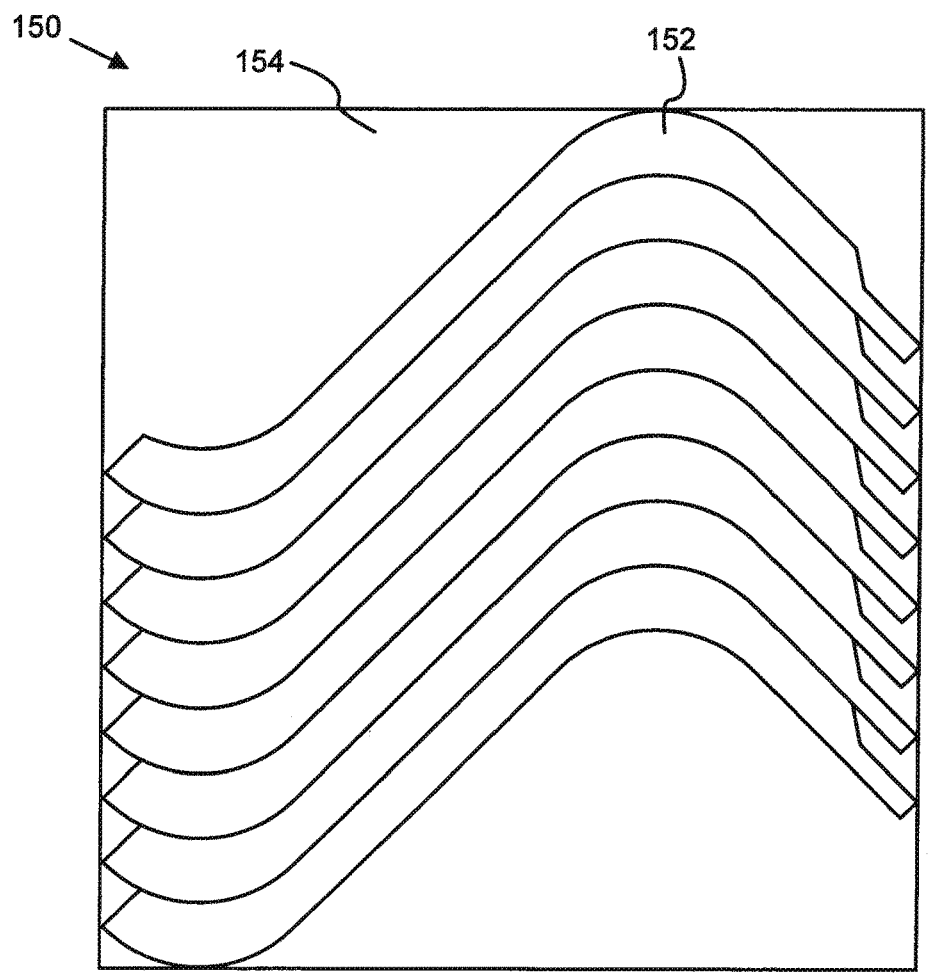
FIG. 8 illustrates another embodiment of a pattern of nested busbar components for photovoltaic modules.

FIG. 8 illustrates another embodiment of a pattern 150 of nested busbar components 152 for PV modules. In particular, the illustrated busbar components 152 are terminal buses 124, as shown in FIG. 6. In one embodiment, the pattern 150 facilitates substantial material utilization between the individual busbar components 152. For example, the shape of the nested busbar components 152 may use all or almost all of the conductive sheet 154 between the nested busbar components 152.

Figure 9:
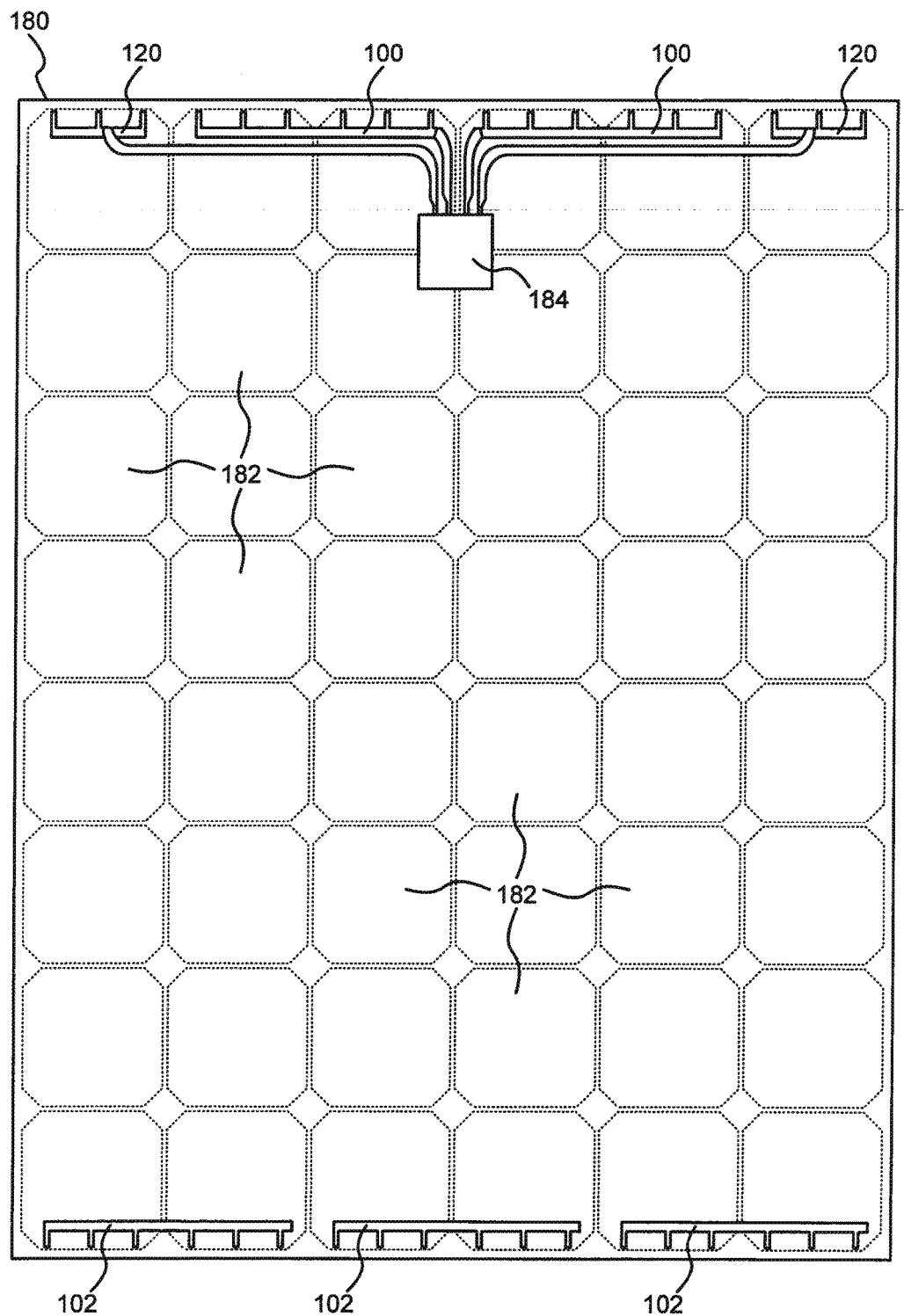
FIG. 9 illustrates one embodiment of a photovoltaic module with a plurality of formed busbars.

FIG. 9 illustrates one embodiment of a photovoltaic (PV) module 180 with a plurality of formed busbars 100 and 120. In particular, FIG. 9 shows the back side of the PV module 180, which is not typically seen from the outside of the PV module 180. The depicted PV module 180 includes an array (e.g., a 6×8 array) of PV cells 182. The PV cells 182 are shown dashed to indicate that they are located on the front of the PV module 180, rather than on the back. At one end of each column of cells 182, formed busbars 100 and 120 couple the columns of cells 182 to a junction box 184 coupled to the PV module 180. At the opposite end of each column of cells 182, formed cell connection pieces 102 couple pairs of columns together. In one embodiment, the shape of the cell connection piece 102 is universal in that it may be used at either end of the columns of cells 182. Implementing a universal cell connection piece 102 in this manner may eliminate the need to fabricate, store, and inventory an additional number of different types of busbar components. FIG. 9 also illustrates that the busbar components may be located behind the PV cells 182 to improve the aesthetic look and electrical efficiency of the PV module 180.

Figure 10:
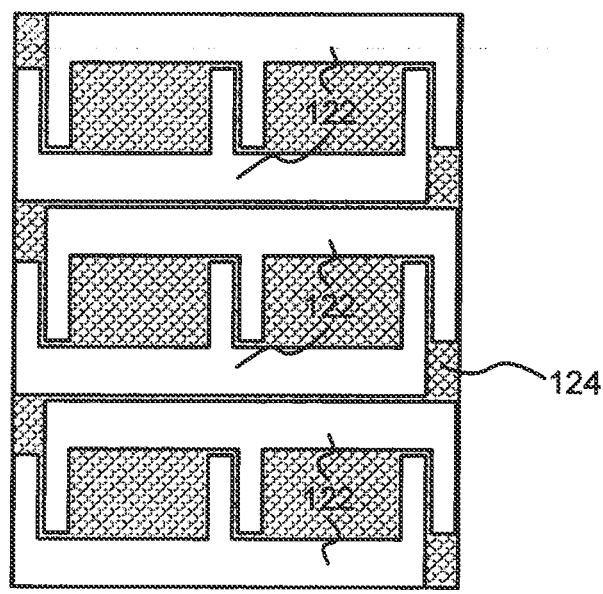
FIG. 10 illustrates one embodiment of a manufacturing pattern for a plurality of formed busbar components for photovoltaic modules.

FIG. 10 illustrates one embodiment of a manufacturing pattern 200 for a plurality of unitarily formed busbar components 122 for PV modules. The depicted manufacturing pattern 200 orients multiple cell connection pieces 122 in an opposing and offset orientation. In particular, the bus tabs 110 of each cell connection piece 122 are directed to the interconnect bus 108 of the opposing cell connection piece 122, and some of the bus tabs 110 of each cell connection piece 122 are located between the bus tabs 110 of the opposing cell connection piece 122. The orientation of the opposing cell connection pieces 122 in this manufacturing pattern 200 may reduce the amount of unutilized material between the opposing cell connection pieces 122. By orienting the pairs of cell connection pieces 122 in a back-to-back pattern on a conductive sheet 124, as shown, the material utilization between the pairs of cell connection pieces 122 can be very high (the unused material is indicated with cross-hatching).

Figure 11:
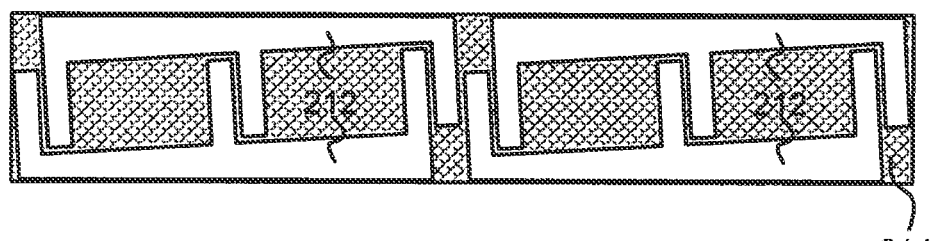
FIG. 11 illustrates another embodiment of a manufacturing pattern for a plurality of formed busbar components for photovoltaic modules.

FIG. 11 illustrates another embodiment of a manufacturing pattern 210 for a plurality of unitarily formed busbar components 212 for PV modules. The depicted cell connection pieces 212 are similar to the cell connection pieces 122, except that the cell connection pieces 212 have interconnect buses 108 with a continuously variable width along the length of each interconnect bus 108. Implementing the cell connection pieces 212 may reduce the amount of material for each cell connection piece 212 according to the reduced width of the interconnect bus 108. In one embodiment, the pairs of cell connection pieces 212 are arranged on a conductive sheet 214 in a side-to-side pattern, as shown. Alternatively, adjacent pairs of cell connection pieces 212 may be arranged in a back-to-back pattern as shown in FIG. 10, so that the tapered edge of one cell connection piece 212 may coordinate with the tapered edge of another cell connection piece 212 (e.g., a third cell connection piece 212) to eliminate material waste between adjacent sets of cell connection pieces 212 (the unused material is indicated with cross-hatching).

Figure 12:
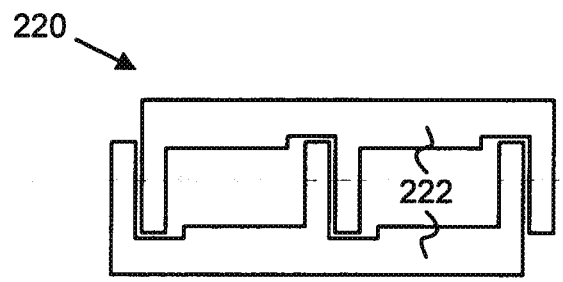
FIG. 12 illustrates another embodiment of a manufacturing pattern for a plurality of formed busbar components for photovoltaic modules.

FIG. 12 illustrates another embodiment of a manufacturing pattern 220 for a plurality of unitarily formed busbar components 222 for PV modules. The depicted cell connection pieces 222 are similar to the cell connection pieces 122, except that the cell connection pieces 222 have interconnect buses 108 with notches to allow the bus tabs 110 of the opposite cell connection piece 222 to extend into the notches. By allowing the bus tabs 110 of the opposing cell connection pieces 222 to extend into the notches in the corresponding interconnect buses 108, the combined area of the manufacturing pattern 220 may be reduced compared to the combined area of the manufacturing pattern 200 of FIG. 10 (without the notches). In other words, there may be less unutilized material between the opposing cell connection pieces 222 of FIG. 12.

Figure 13:
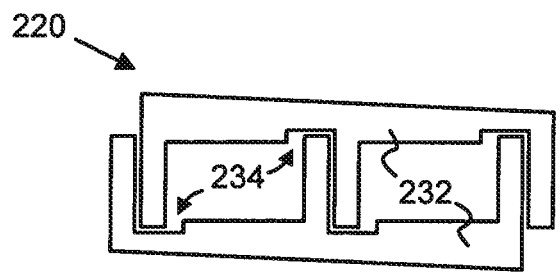
FIG. 13 illustrates another embodiment of a manufacturing pattern for a plurality of formed busbar components for photovoltaic modules.

FIG. 13 illustrates another embodiment of a manufacturing pattern 230 for a plurality of unitarily formed busbar components 232 for PV modules. The depicted cell connection pieces 232 are similar to the cell connection pieces 222, except that the cell connection pieces 232 have interconnect buses 108 with a continuously variable width along the length of the interconnect bus 108. As described above with reference to the cell connection pieces 212 of FIG. 11, implementing the cell connection pieces 232 with tapered edges may reduce the amount of unutilized material for each cell connection piece 232 according to the reduced width of the interconnect bus 108.

Figure 14:
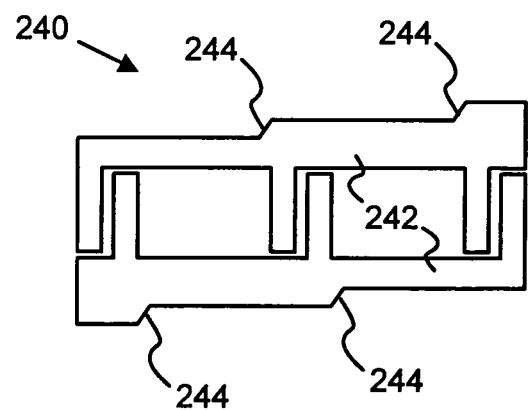
FIG. 14 illustrates another embodiment of a manufacturing pattern for a plurality of formed busbar components for photovoltaic modules.

FIG. 14 illustrates another embodiment of a manufacturing pattern 240 for a plurality of unitarily formed busbar components 242 for PV modules. The depicted cell connection pieces 242 are similar to the cell connection pieces 232 of FIG. 13, except that the cell connection pieces 242 have interconnect buses 108 with a step-wise variable width along the length of the interconnect bus 108. In one embodiment, the step-wise variable width of the interconnect bus 108 may reduce the amount of material used for the cell connection piece 242. In some embodiments, the step-wise variable edge of the interconnect bus 108 may coordinate with the step-wise variable edge of another cell connection piece 242 (e.g., a third cell connection piece 242) to eliminate material waste between adjacent sets of cell connection pairs (because the sets of cell connection pairs are aligned at the step-wise variable edges of the interconnect buses 108).

Figure 15:
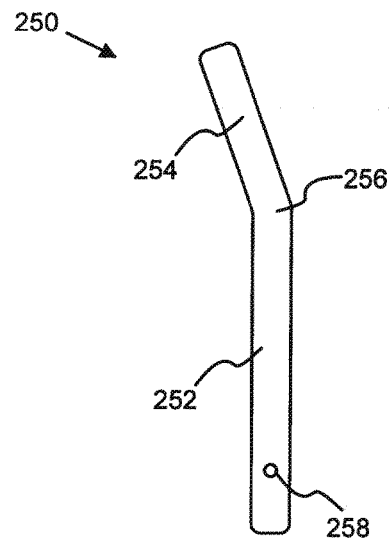
FIG. 15 illustrates one embodiment of an angled terminal bus.

FIG. 15 illustrates one embodiment of an angled terminal bus 250. The angled terminal bus 250 is another example of a non-linear terminal connection piece, as described above. The depicted angled terminal bus 250 includes two linear portions 252 and 254 connected by a non-zero angled portion 256. Similar to the non-linear portion 114 of the terminal connection piece 104 of FIG. 5, the angled portion 256 of the terminal bus 250 may be designed to avoid an overlap with an edge of a corresponding PV cell 182. Additionally, the angled portion 256 of the terminal bus 250 may provide a relatively shorter electrical path between a corresponding cell connection piece 102 and the junction box 184 of the PV module 180.

The depicted angled terminal bus 250 also includes a unitarily stamped hole 258. Alternatively, the hole 258 may be formed in another manner consistent with the formation technology used to form the angled terminal bus 250. In one embodiment, the hole 258 is used to allow a fastener within the junction box 184 to secure the terminal bus 250 to an electrical terminal (not shown) within the junction box 184. For example, a screw may be used to fasten the terminal bus 250 to the electrical terminal, although other types of fasteners may be used in other embodiments.

Figure 16:
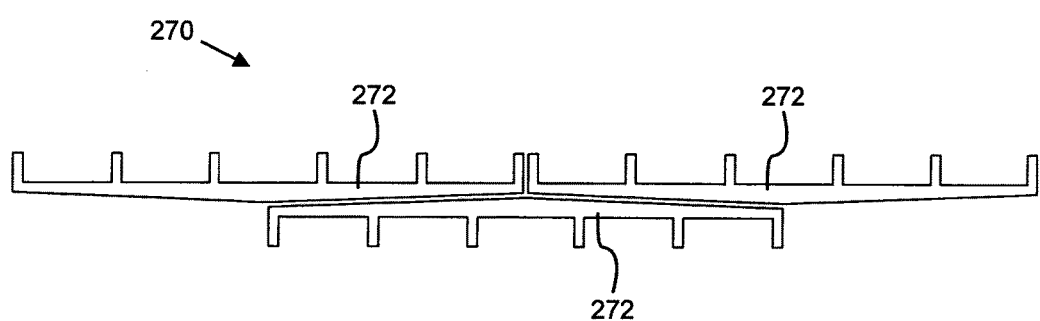
FIG. 16 illustrates another embodiment of a manufacturing pattern for a plurality of formed busbar components for photovoltaic modules.

FIG. 16 illustrates another embodiment of a manufacturing pattern 270 for a plurality of unitarily formed busbar components 272 for PV modules. The depicted cell connection pieces 272 are similar to the cell connection pieces 122 of FIG. 10, except that the cell connection pieces 272 have more bus tabs 110 and the interconnect buses 108 have a symmetrically variable width along the length of the interconnect bus 108. In one embodiment, the symmetrically variable width of the interconnect bus 108 may reduce the amount of material used for the cell connection piece 272. In some embodiments, the symmetrically variable width of the interconnect bus 108 may coordinate with the symmetrically variable edge of one or more other cell connection piece 272 to eliminate material waste between adjacent sets of cell connection pairs. Additionally, the symmetrically variable width of the interconnect bus 108 may provide a convenient location for a central solder joint at about the widest portion of the interconnect bus 108. In further embodiments, the cell connection pieces 272 may be used for string-to-string connection without a terminal bus (similar to the cell connection pieces 102 at the bottom of FIG. 9). Also, the sloping of the interconnect bus 108 may be designed to be consistent with the amount of current that may be needed to be carried in the bus.

Figure 17:
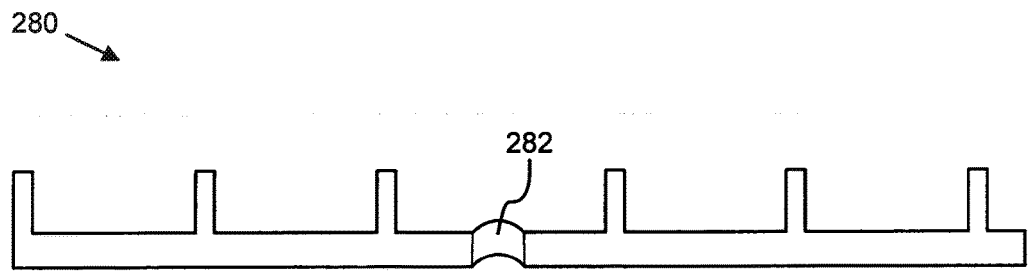
FIG. 17 illustrates another embodiment of a formed cell connection piece having an expansion joint.

FIG. 17 illustrates another embodiment of a unitary cell connection piece 280 having an expansion joint 282. The use of an expansion joint 282 may accommodate thermal expansion of the various parts of the PV module 180, since the PV cells 182 and PV module 180 likely have a different thermal coefficient of expansion than the conductive material used for the busbar components. In this way, the expansion joint 282 lowers stress, thereby improving reliability. Although the expansion joint 282 is shown in a particular location between two groups of bus tabs 110, the expansion joint 282 may be located at another location along the interconnect bus 108. Additionally, a busbar component may include multiple expansion joints 282. In some embodiments, terminal connection pieces 104 also may include similar expansion joints. The expansion joints 282 may be formed in a variety of ways, including crimping or otherwise bending the interconnect bus 108. In one embodiment, the expansion joint may be formed during a stamping process. Alternatively, the expansion joint may be formed in another manner.

Figure 18:
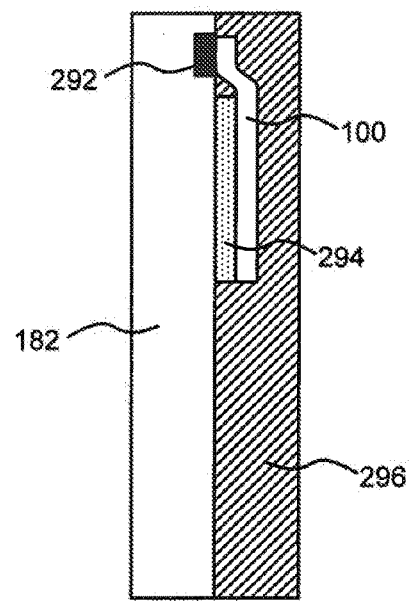
FIG. 18 illustrates one embodiment of an electrical insulator between a busbar and a back contact cell.

FIG. 18 illustrates a side view of one embodiment of a busbar 100 coupled to a back contact cell 182. In particular, the busbar 100 is coupled to the back contact 292 on the back side of the cell 182. In order to prevent the busbar 100 from contacting any electrical components on the back of the cell 182, an electrical insulator material 294 is provided between the busbar 100 and the back of the cell 182. A laminate material 296 is provided to cover the busbar 100 and insulator material 294.

In one embodiment, the electrical insulator material 294 is EPE (EVA/polyester/EVA) made from 101.6 µm (4 mils) ethylene vinyl acetate (EVA), 50.8 µm (2 mils) polyester, and 101.6 µm (4 mils) EVA. Alternatively, other insulator materials may be used. In some embodiments, the insulator material 294 may be applied to the busbar 100. In some embodiments, the insulator material 294 may be made to have a certain color (e.g., white or black). Alternatively, the insulator material 294 may be transparent. In embodiments where the busbar 100 is not adjacent to the cell 182, the insulator material 294 may be omitted.

For PV modules 180 which use electrical ribbons instead of back contacts, the busbars 100 may couple to the electrical ribbon. Where the ribbons are provided on the front of the cell 182, the ribbons may be folded over behind a cell 182 for connection to the busbar 100. Alternatively, the ribbons may extend past the cell 182 and the busbar may be located away from the cell 182, rather than behind the cell 182. Other embodiments may implement other configurations.

Figure 19:
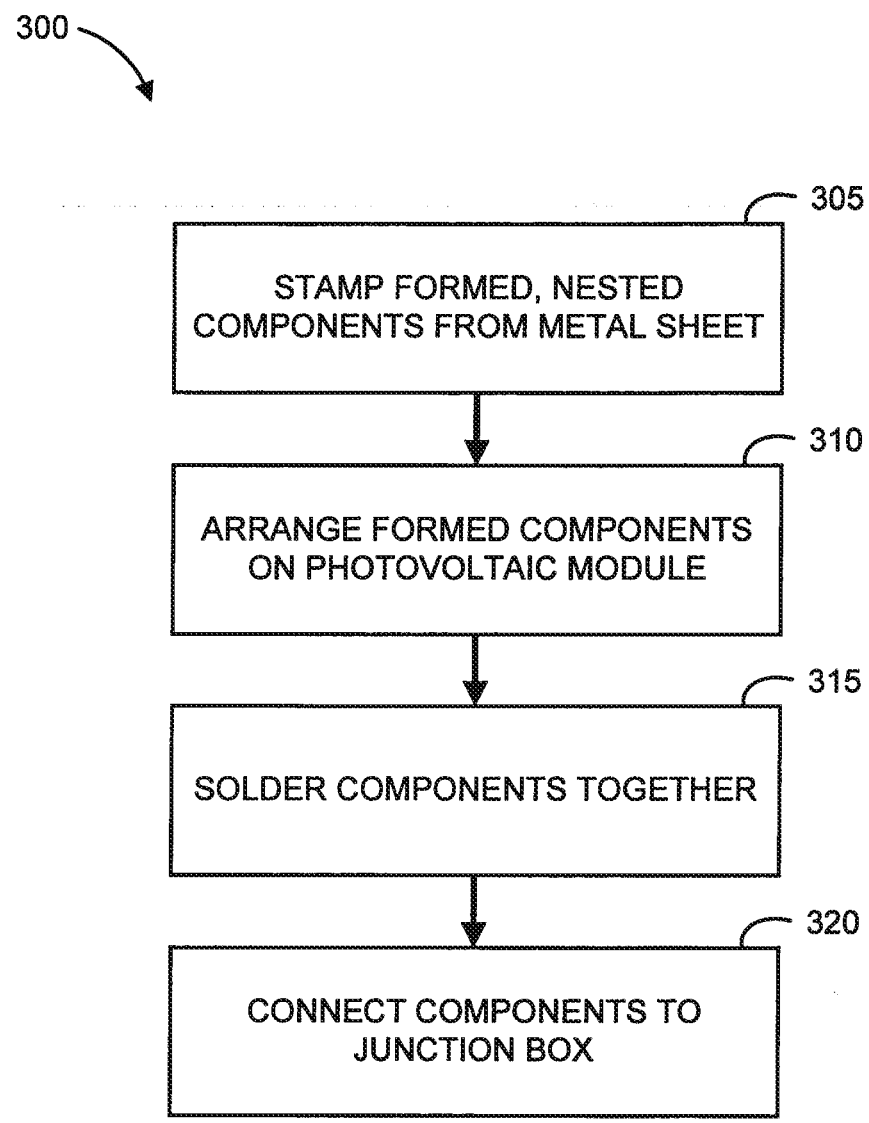
FIG. 19 illustrates a flow chart diagram of one embodiment of a fabrication method for using formed busbars to fabricate a photovoltaic module.

FIG. 19 illustrates a flow chart diagram of one embodiment of a fabrication method 300 for using unitarily formed busbars 100 to fabricate a PV module 180. Alternatively, other embodiments of the fabrication method 300 may include additional operations or fewer operations than are shown and described herein.

The depicted fabrication method 300 begins as unitarily formed, nested busbar components are stamped 305 from a metal sheet or other conductive material. In one embodiment, the busbar components include cell connection pieces 102 or terminal connection pieces 104, or both. Subsequently, individual formed busbar components such as a cell connection piece 102 and a terminal connection piece 104 are arranged 310 on a PV module 180. The busbar components are then soldered 315 together and coupled to the cell contacts or cell ribbons. In one embodiment, heat insulators (not shown) may be used to provide insulation for the PV cells 182 against the heat and pressure generated at the solder joint 106 to couple the cell connection piece 102 and the terminal connection piece 104. The busbar components are then connected 320 to the junction box 184. In particular, the terminal bus 104 may be secured to an electrical terminal within the junction box 184. The illustrated fabrication method 300 then ends.

Embodiments of the present invention, described herein, include various operations. These operations may be performed manually, automatically, or a combination thereof. Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A photovoltaic system, comprising:
    a plurality of photovoltaic cells within a photovoltaic module;
    a junction box coupled to the photovoltaic module, the junction box having a terminal; and
    a cell connection assembly comprising:
        a cell connection piece coupled to one or more of the plurality of photovoltaic cells, the cell connection piece comprising an interconnect bus and a plurality of bus tabs unitarily formed with the interconnect bus, wherein the plurality of bus tabs extend from only a single side of the interconnect bus; and
        a terminal bus bar coupled with the interconnect bus of the cell connection piece, the terminal bus bar coupled to the interconnect bus at a solder joint, the terminal bus bar including a first portion defining a non-orthogonal, curvilinear shape and a second portion defining either a tapered shape or a hole to facilitate coupling of the second portion of the terminal bus bar to the terminal of the junction box.

2. The photovoltaic system of claim 1, wherein the junction box is coupled to the photovoltaic module to facilitate electrical coupling of the photovoltaic module to an external component of the photovoltaic system.

3. The photovoltaic system of claim 1, wherein the interconnect bus of the cell connection piece has a continuously variable width along a length of the interconnect bus.

4. The photovoltaic system of claim 1, wherein the interconnect bus of the cell connection piece has a step-wise variable width along a length of the interconnect bus.

5. The photovoltaic system of claim 1, wherein the interconnect bus of the cell connection piece comprises an extension at an end of the interconnect bus, the solder joint formed at the extension.

6. The photovoltaic system of claim 1, wherein the interconnect bus of the cell connection piece comprises an expansion joint to accommodate thermal expansion of the photovoltaic module, wherein the expansion joint is unitarily formed with the cell connection piece.

7. The photovoltaic system of claim 1, wherein the interconnect bus of the cell connection piece comprises a plurality of notches to accommodate a second plurality of bus tabs of a second cell connection piece in a fabrication process of the cell connection pieces.

8. The photovoltaic system of claim 1, wherein the interconnect bus of the cell connection piece is formed from a sheet of conductive material.

9. A photovoltaic system, comprising:
    a plurality of photovoltaic cells within a photovoltaic module;
    a junction box coupled to the photovoltaic module, the junction box having a terminal; and
    a plurality of cell connection assemblies, each cell connection assembly comprising:
        a cell connection piece coupled to one or more of the plurality of photovoltaic cells, the cell connection piece comprising an interconnect bus and a plurality of bus tabs unitarily formed with the interconnect bus, wherein the plurality of bus tabs extend from only a single side of the interconnect bus; and
        a terminal bus bar coupled with the interconnect bus of the cell connection piece, the terminal bus bar coupled to the interconnect bus at a solder joint, the terminal bus bar including a first portion defining a non-orthogonal, curvilinear shape and a second portion defining either a tapered shape or a hole to facilitate coupling of the second portion of the terminal bus bar to the terminal of the junction box.

10. The photovoltaic system of claim 9, wherein the junction box is coupled to the photovoltaic module to facilitate electrical coupling of the photovoltaic module to an external component of the photovoltaic system.

11. The photovoltaic system of claim 9, wherein the interconnect bus of the cell connection piece of each of the plurality of cell connection assemblies has a continuously variable width along a length of the interconnect bus.

12. The photovoltaic system of claim 9, wherein the interconnect bus of the cell connection piece of each of the plurality of cell connection assemblies has a step-wise variable width along a length of the interconnect bus.

13. The photovoltaic system of claim 9, wherein the interconnect bus of the cell connection piece of each of the plurality of cell connection assemblies comprises an extension at an end of the interconnect bus, the solder joint formed at the extension.

14. The photovoltaic system of claim 9, wherein the interconnect bus of the cell connection piece of each of the plurality of cell connection assemblies comprises an expansion joint to accommodate thermal expansion of the photovoltaic module, wherein the expansion joint is unitarily formed with the cell connection piece.

15. The photovoltaic system of claim 9, wherein the interconnect bus of the cell connection piece of each of the plurality of cell connection assemblies comprises a plurality of notches to accommodate a second plurality of bus tabs of a second cell connection piece in a fabrication process of the cell connection pieces.

16. The photovoltaic system of claim 9, wherein the interconnect bus of the cell connection piece of each of the plurality of cell connection assemblies is formed from a sheet of conductive material.

* * * * *